United States Patent
Ishiduki

(10) Patent No.: US 12,293,968 B2
(45) Date of Patent: May 6, 2025

(54) SEMICONDUCTOR DEVICE

(71) Applicant: Kioxia Corporation, Tokyo (JP)

(72) Inventor: Megumi Ishiduki, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 448 days.

(21) Appl. No.: 17/654,443

(22) Filed: Mar. 11, 2022

(65) Prior Publication Data

US 2023/0085271 A1 Mar. 16, 2023

(30) Foreign Application Priority Data

Sep. 15, 2021 (JP) .................. 2021-150272

(51) Int. Cl.
| | | |
|---|---|---|
| *H01L 29/76* | (2006.01) | |
| *H01L 23/528* | (2006.01) | |
| *H01L 23/535* | (2006.01) | |
| *H10B 41/27* | (2023.01) | |
| *H10B 43/27* | (2023.01) | |

(52) U.S. Cl.
CPC ........ *H01L 23/5283* (2013.01); *H01L 23/535* (2013.01); *H10B 41/27* (2023.02); *H10B 43/27* (2023.02)

(58) Field of Classification Search
CPC ... H01L 23/5283; H01L 23/535; H10B 41/27; H10B 43/27; H10B 43/50; H10B 43/10
USPC ........................................................ 257/314
See application file for complete search history.

(56) References Cited

U.S. PATENT DOCUMENTS

| | | | |
|---|---|---|---|
| 10,199,375 B2 | 2/2019 | Nojima | |
| 2016/0079185 A1* | 3/2016 | Kato | H10B 43/27 |
| | | | 257/314 |
| 2016/0111438 A1 | 4/2016 | Tsutsumi et al. | |
| 2020/0027800 A1 | 1/2020 | Yamamoto et al. | |
| 2021/0074711 A1 | 3/2021 | Suzuki et al. | |

FOREIGN PATENT DOCUMENTS

| | | |
|---|---|---|
| JP | 2020-017572 A | 1/2020 |
| JP | 2021-044397 A | 3/2021 |

* cited by examiner

*Primary Examiner* — Theresa T Doan
(74) *Attorney, Agent, or Firm* — Oblon, McClelland, Maier & Neustadt, L.L.P.

(57) ABSTRACT

According to one embodiment, a semiconductor device includes a stacked body in which a plurality of conductive layers including upper conductive layers and lower conductive layers are stacked to be apart from each other in a first direction, and which includes a stairs-shaped end portion, the upper conductive layers functioning as select gate lines for a NAND string, and the lower conductive layers functioning as word lines for the NAND string, a plurality of pillar structures each including a semiconductor layer extending in the first direction through the stacked body, and a first contact connected to two or more first upper conductive layers stacked successively, and provided to extend over upper surfaces of the two or more first upper conductive layers.

15 Claims, 14 Drawing Sheets

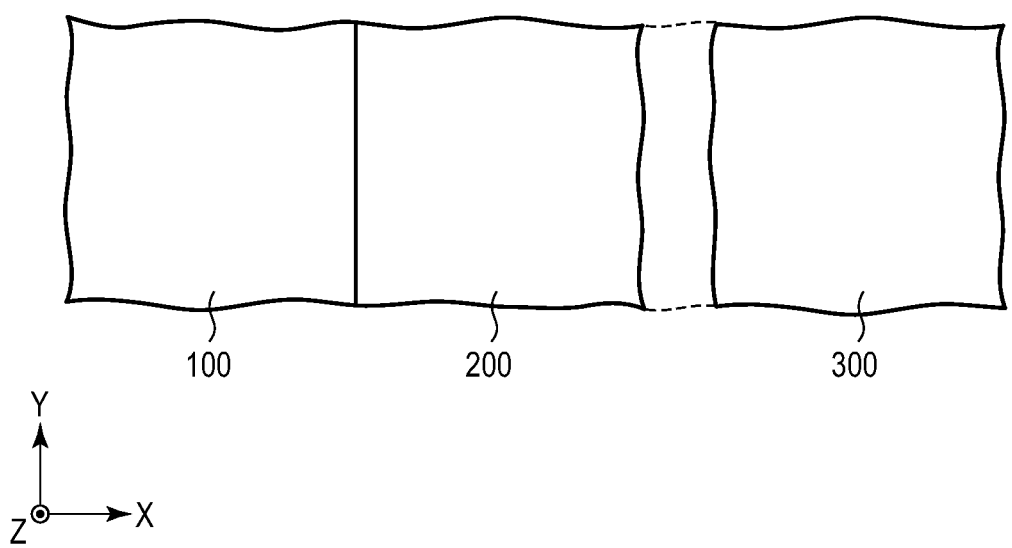
F I G. 1

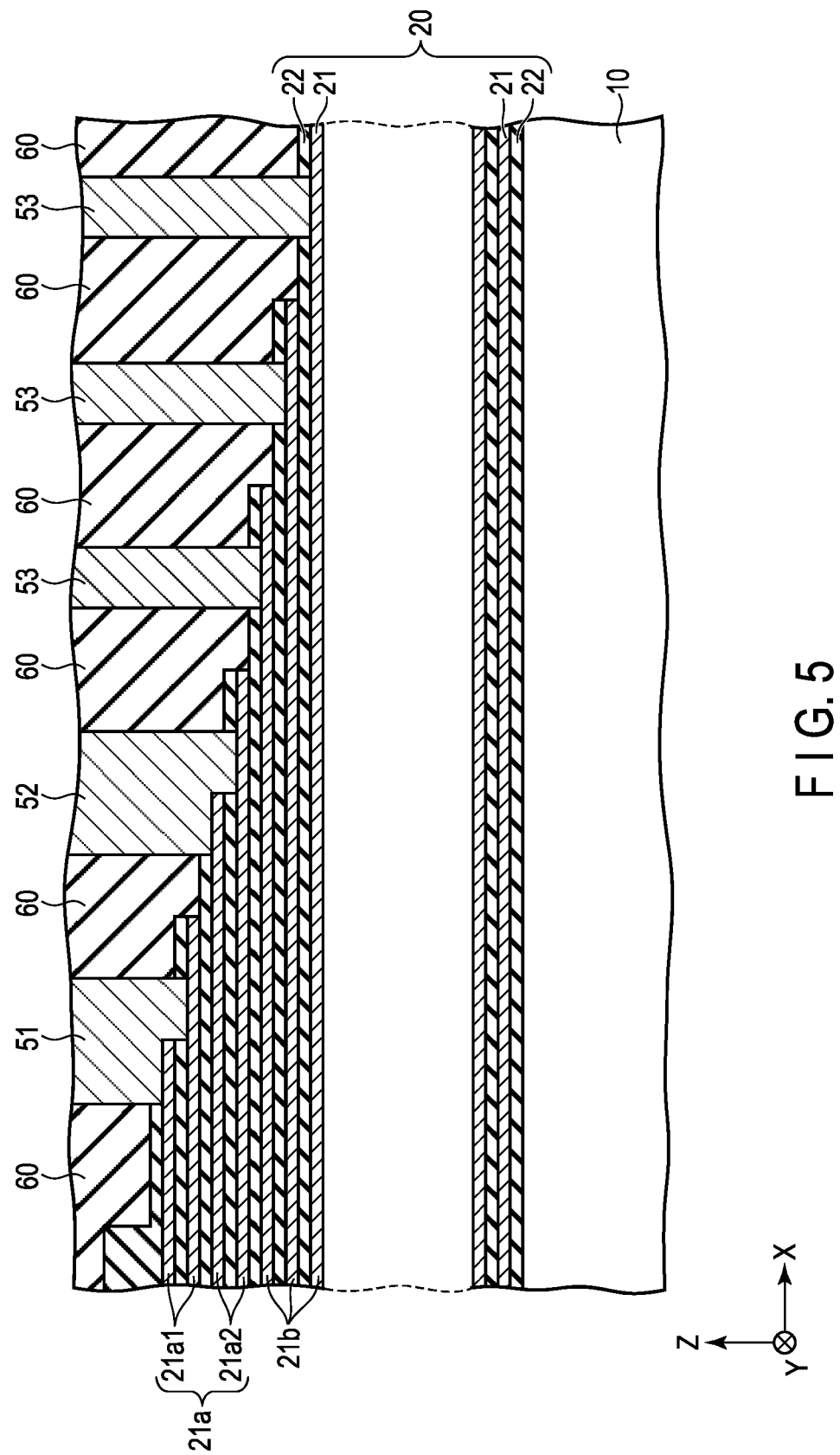
F I G. 5

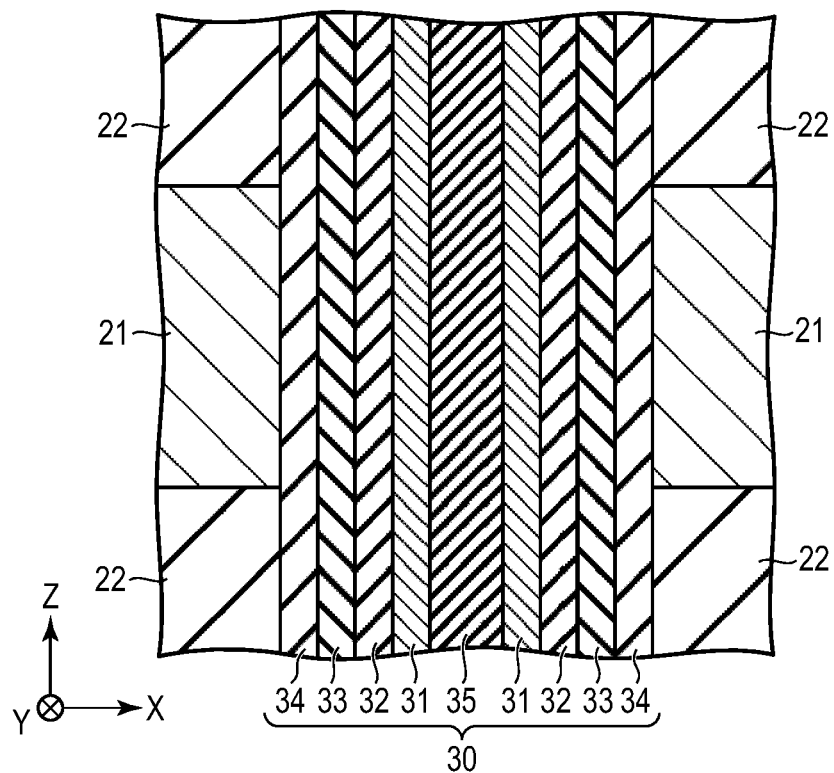
F I G. 6
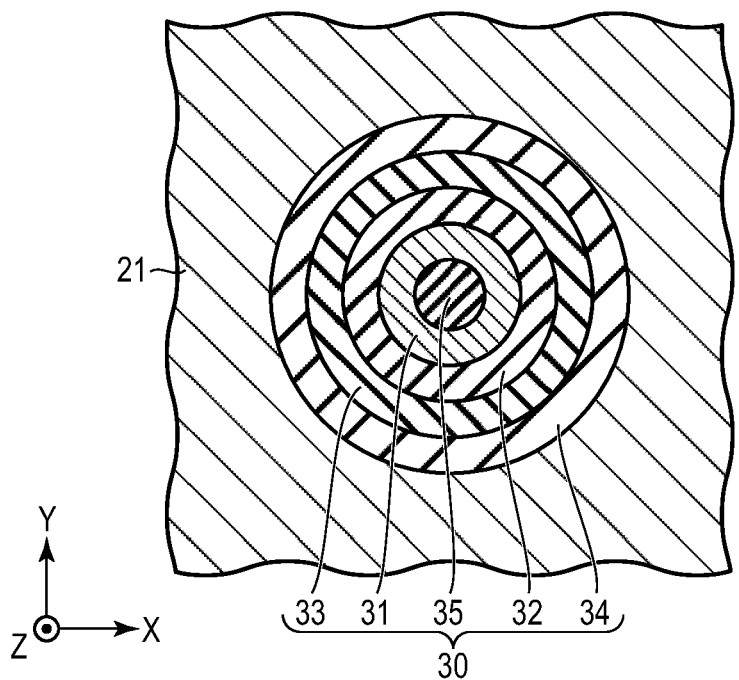
F I G. 7

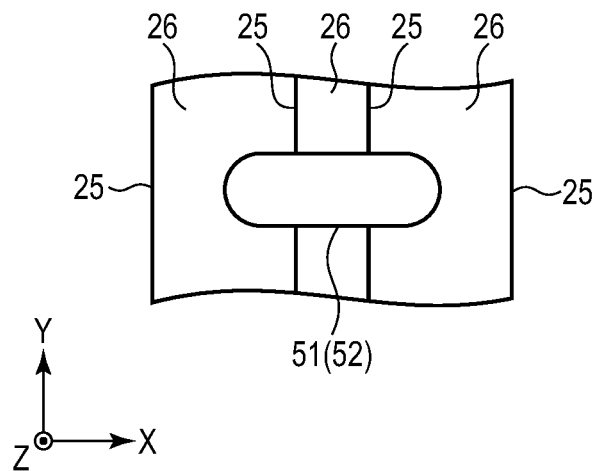
F I G. 15
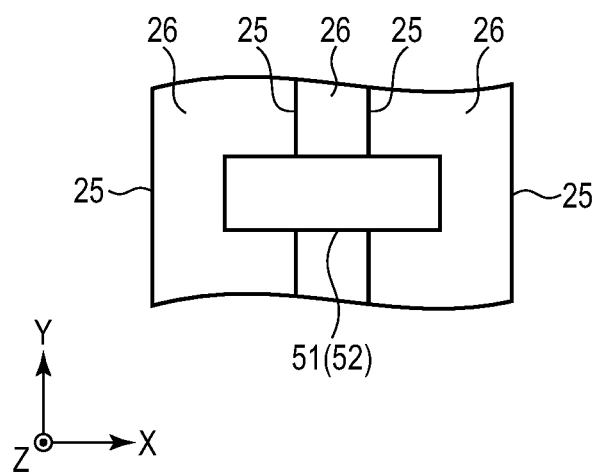
F I G. 16

SEMICONDUCTOR DEVICE

CROSS-REFERENCE TO RELATED APPLICATIONS

This application is based upon and claims the benefit of priority from Japanese Patent Application No. 2021-150272, filed Sep. 15, 2021, the entire contents of which are incorporated herein by reference.

FIELD

Embodiments described herein relate generally to a semiconductor device.

BACKGROUND

In a three-dimensional nonvolatile memory in which a plurality of memory cells are stacked in a perpendicular direction, an area to connect contacts to lines extending from the memory cells is provided.

BRIEF DESCRIPTION OF THE DRAWINGS

FIG. 1 is a view schematically showing an entire arrangement configuration of a semiconductor memory device according to an embodiment.

FIG. 5 is a cross-sectional view schematically showing the configuration of the stairs region in the semiconductor memory device according to the embodiment.

FIG. 6 is a cross-sectional view schematically showing a detailed configuration of a memory cell portion in the semiconductor memory device according to the embodiment.

FIG. 7 is a cross-sectional view schematically showing a detailed configuration of the memory cell portion in the semiconductor memory device according to the embodiment.

FIG. 15 is a planar pattern view schematically showing a first modified example of a planar shape of a contact in the semiconductor memory device according to the embodiment.

FIG. 16 is a planar pattern view schematically showing a second modified example of the planar shape of the contact in the semiconductor memory device according to the embodiment.

DETAILED DESCRIPTION

In general, according to one embodiment, a semiconductor device includes: a stacked body in which a plurality of conductive layers including a plurality of upper conductive layers and a plurality of lower conductive layers provided on a lower layer side of the plurality of upper conductive layers are stacked to be apart from each other in a first direction, and which includes a stairs-shaped end portion, the plurality of upper conductive layers functioning as select gate lines for a NAND string, and the plurality of lower conductive layers functioning as word lines for the NAND string; a plurality of pillar structures each including a semiconductor layer extending in the first direction through the stacked body; and a first contact connected to two or more first upper conductive layers that are included in the plurality of upper conductive layers and that are stacked successively, and provided to extend over upper surfaces of the two or more first upper conductive layers.

Embodiments will be described hereinafter with reference to the accompanying drawings.

FIG. 1 schematically shows an entire arrangement configuration of a non-volatile semiconductor memory device according to the embodiment. The X direction, Y direction, and Z direction shown in the figures are directions intersecting each other. More specifically, the X direction, the Y direction, and the Z direction are directions orthogonal to each other.

As shown in FIG. 1, the semiconductor memory device according to the embodiment includes a memory region 100, a stairs region 200, and a peripheral circuit region 300, and the memory region 100, the stairs region 200, and the peripheral circuit region 300 are provided on the same semiconductor substrate.

A NAND-type nonvolatile memory cell array having a three-dimensional structure is provided in the memory region 100. More specifically, a NAND string is formed of a plurality of memory cells and a plurality of select transistors arranged in a direction perpendicular to the semiconductor substrate (Z direction).

The stairs region 200 is provided adjacent to the memory region 100. As described below, a plurality of contacts for supplying signals to the memory region 100 are connected to an end portion of the stairs region 200.

Peripheral circuits for the memory cell array provided in the memory region 100 are provided in the peripheral circuit region 300.

Figure 2:
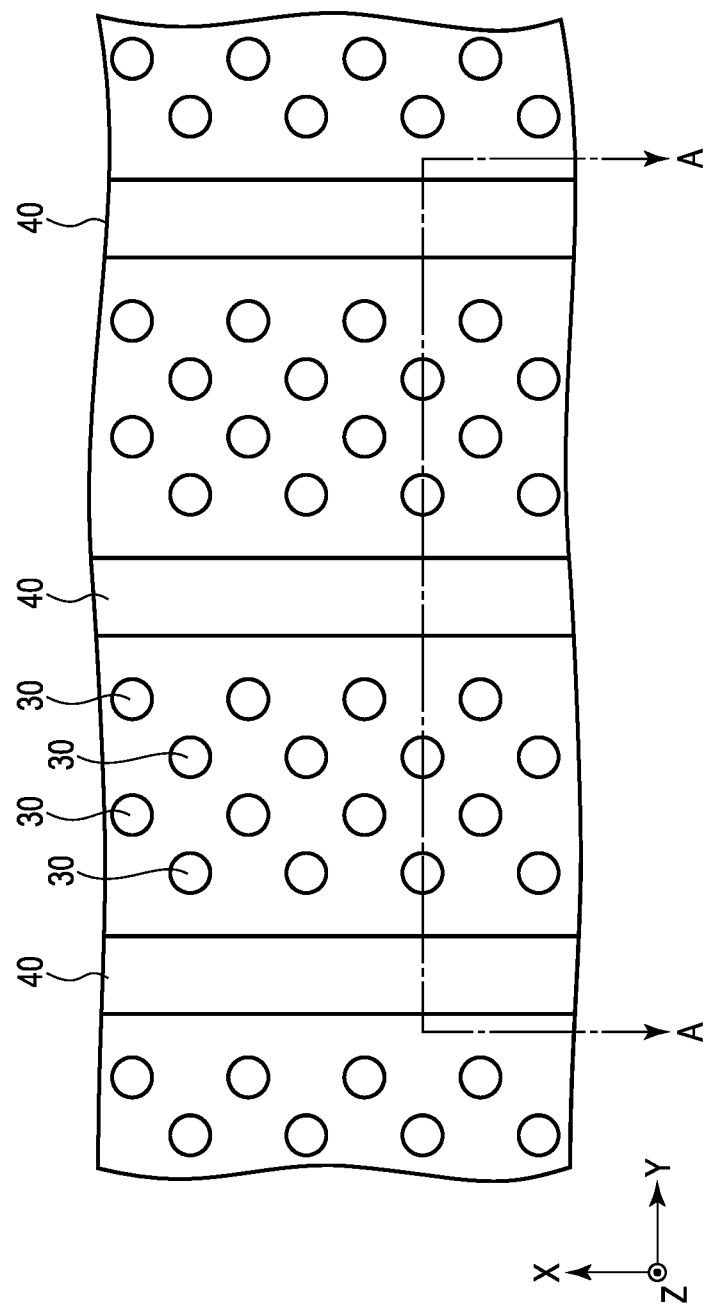
FIG. 2 is a planar pattern view schematically showing a configuration of a memory region in the semiconductor memory device according to the embodiment.
Figure 3:
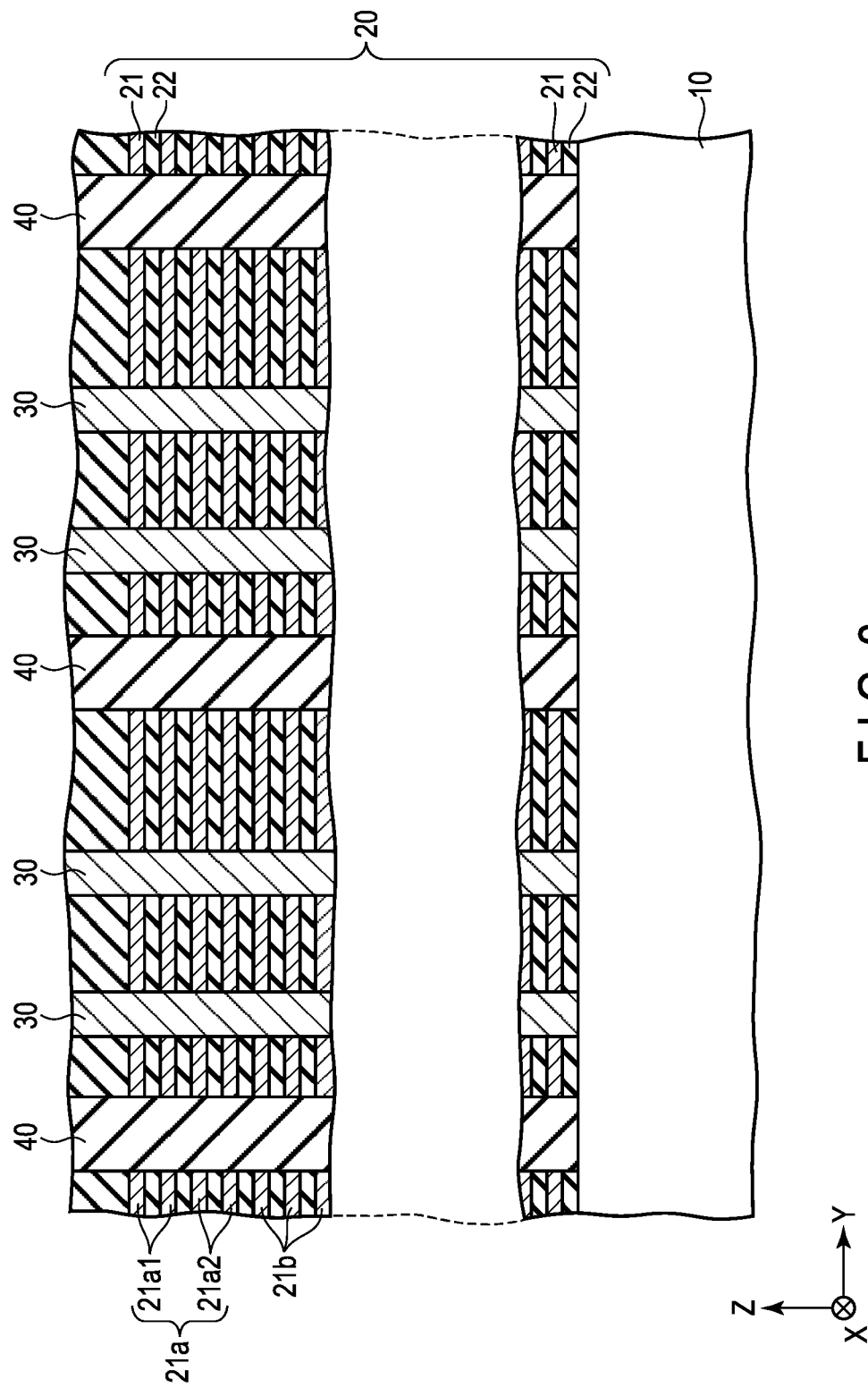
FIG. 3 is a cross-sectional view schematically showing the configuration of the memory region in the semiconductor memory device according to the embodiment.
Figure 4:
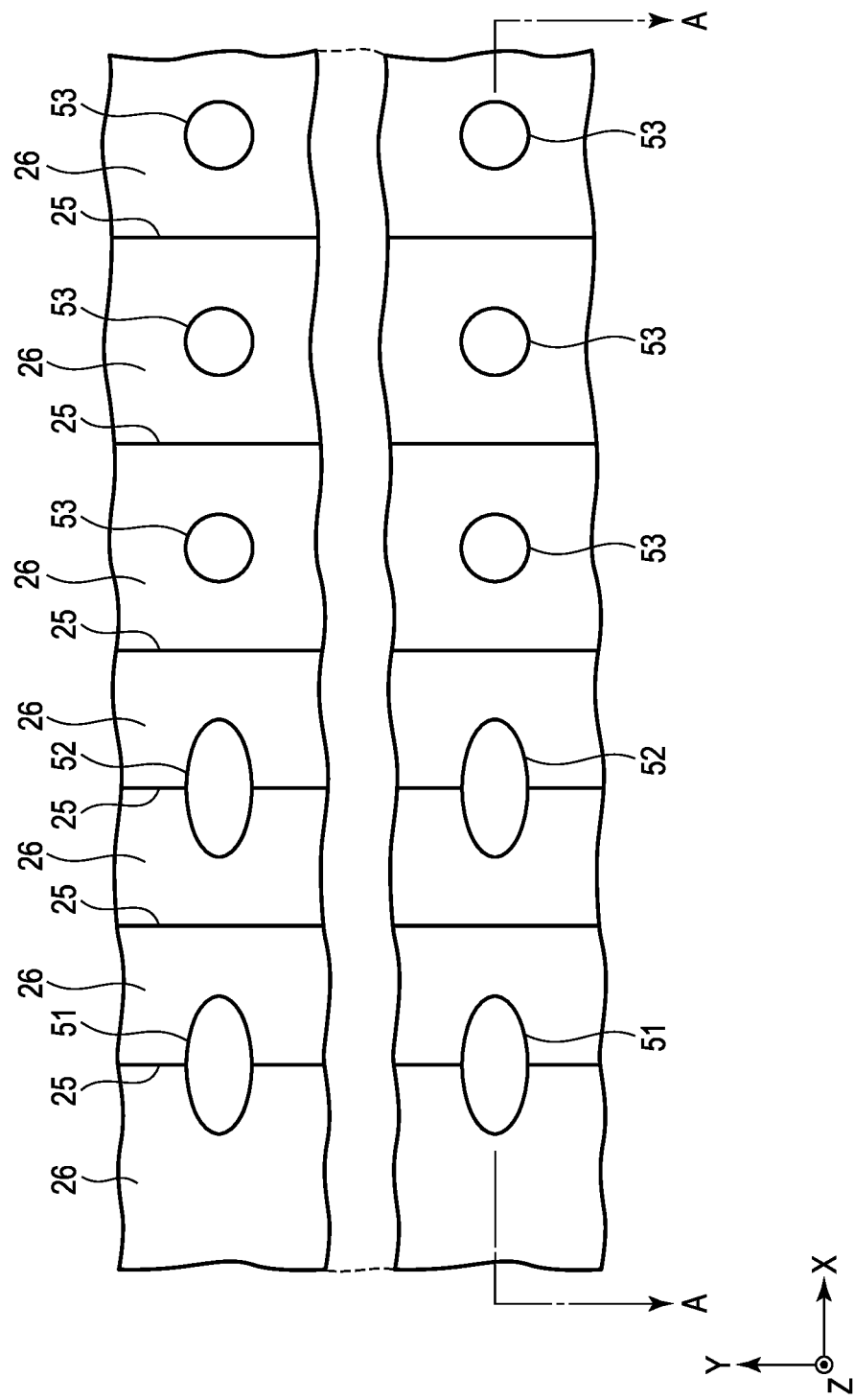
FIG. 4 is a planar pattern view schematically showing a configuration of a stairs region in the semiconductor memory device according to the embodiment.

FIG. 2 is a planar pattern view schematically showing a configuration of the memory region 100, and FIG. 3 is a cross-sectional view schematically showing the configuration of the memory region 100. The cross section taken along line A-A in FIG. 2 corresponds to FIG. 3. FIG. 4 is a planar pattern view schematically showing a configuration of the stairs region 200, and FIG. 5 is a cross-sectional view schematically showing the configuration of the stairs region 200. The cross section taken along line A-A in FIG. 4 corresponds to FIG. 5.

In the memory region 100 and the stairs region 200, a stacked body 20, a plurality of pillar structures 30, a plurality of partition structures 40, contacts 51 to 53, and an interlayer insulating layer 60 are provided on the semiconductor substrate 10.

The stacked body 20 has a structure in which a plurality of conductive layers 21 are stacked to be apart from each other in the Z direction. More specifically, the stacked body 20 has a structure in which a plurality of conductive layers 21 and a plurality of insulating layers 22 are alternately stacked in the Z direction.

The stacked body 20 has a stairs-shaped end portion defined by a plurality of steps. Each of the steps is defined by a rising portion 25 that is substantially parallel to the Z direction, and a terrace portion (terrace surface) 26 that extends substantially parallel to an XY plane (i.e., a plane perpendicular to the Z direction) from an upper end of the rising portion 25. In other words, the stacked body 20 has stairs-shaped end portion that includes a plurality of rising portions 25 and a plurality of terrace portions (excluding an uppermost terrace portion) 26. In the specification, the direction in which the terrace portions (terrace surfaces) 26 face is defined as an upward direction.

Each of the conductive layers 21 functions as a word line or select gate line for a NAND string, and each insulating layer 21 comprises a function of insulating adjacent conductive layers 21. The conductive layers 21 are formed of a metal material such as tungsten, and the insulating layers 22 are formed of an insulating material such as a silicon oxide.

In the plurality of conductive layers 21, the plurality of upper conductive layers 21a provided on the upper layer side, including the uppermost conductive layer 21, function as upper select gate lines, and the plurality of lower conductive layers 21b provided on the lower layer side function as word lines. In addition, one or more conductive layers 21 that function as lower select gate lines, are provided on a further lower layer side of the plurality of lower conductive layers 21b that function as word lines.

In the example shown in FIG. 2 to FIG. 5, four upper conductive layers (upper select gate lines) 21a are provided. A common signal is supplied to the two upper conductive layers 21a1 on the upper layer side, and a common signal is supplied to the two upper conductive layers 21a2 on the lower layer side. In addition, when erasing data stored in the memory cell, a voltage higher than that at a normal selection is applied to the two upper conductive layers 21a1 on the upper layer side. In other words, when erasing data stored in a memory cell, a voltage higher than that applied to the two upper conductive layers 21a2 on the lower layer side is applied to the two upper conductive layers 21a1 on the upper layer side.

Each of the pillar structures 30 extends in the Z direction through the stacked body 20, and includes a semiconductor layer extending in the Z direction and a charge storage layer surrounding side surface of the semiconductor layer.

The pillar structure 30 is surrounded by a plurality of conductive layers 21 and a plurality of insulating layers 22, and a NAND string is formed by the pillar structure 30 and the plurality of conductive layers 21 surrounding the pillar structure 30. More specifically, the memory cell is formed by the conductive layer 21 that function as the word line and the portion of the pillar structure 30 surrounded by the conductive layer 21 which functions as the word line. In addition, a select transistor is formed by the conductive layer 21 which functions as the select gate line and the portion of the pillar structure 30 surrounded by the conductive layer 21 which functions as the select gate line.

Two or more upper select transistors (four upper select transistors in the example shown in FIG. 2 to FIG. 5) are formed by an upper portion of the pillar structure 30 and two or more conductive layers 21 corresponding to the upper portion of the pillar structure 30 (four upper conductive layers 21a in the example shown in FIG. 2 to FIG. 5), and one or more lower select transistors are formed by a lower portion of the pillar structure 30 and one or more conductive layers 21 corresponding to the lower portion of the pillar structure 30, and a plurality of memory cells are formed by an intermediate portion of the pillar structure 30 and a plurality of conductive layers 21 corresponding to the intermediate portion of the pillar structures 30 (a plurality of lower conductive layers 21b in the example shown in FIG. 2 to FIG. 5). As can be understood from the above descriptions, a voltage higher than that at normal selection is applied to the two upper select transistors on the upper layer side, of the four upper select transistors, at a time of erasing data.

FIG. 6 and FIG. 7 are cross-sectional views schematically showing the detailed configuration of the memory cell portion constituted by the conductive layer 21 and the pillar structure 30. FIG. 6 is a cross-sectional view in the direction parallel to the Z direction, and FIG. 7 is a cross-sectional view in the direction perpendicular to the Z direction.

The pillar structure 30 includes a semiconductor layer 31, a tunnel insulating layer 32, a charge storage layer 33, a block insulating layer 34, and a core insulating layer 35. Each of the semiconductor layer 31, the tunnel insulating layer 32, the charge storage layer 33, and the block insulating layer 34 has a cylindrical shape, and the core insulating layer 35 has a columnar shape. More specifically, the semiconductor layer 31 surrounds the side surface of the core insulating layer 35, the tunnel insulating layer 32 surrounds the side surface of the semiconductor layer 31, the charge storage layer 33 surrounds the side surface of the tunnel insulating layer 32, and the block insulating layer 34 surrounds the side surface of the charge storage layer 33. For example, the semiconductor layer 31 is formed of silicon, the tunnel insulating layer 32 is formed of silicon oxide, the charge storage layer 33 is formed of silicon nitride, the block insulating layer 34 is formed of silicon oxide, and the core insulating layer 35 is formed of silicon oxide.

Each of the plurality of partition structures 40 extends in the X and Z directions within the stacked body 20, and the stacked body 20 is divided into a plurality of portions in the Y direction by the plurality of partition structures 40. Each portion of the stacked body 20 divided by the partition structures 40 forms, for example, one block which serves as a data erase unit.

As already described, the plurality of upper conductive layers 21a that include the uppermost conductive layer 21 and that are provided on the upper layer side function as upper select gate lines. The contact 51 is connected to two or more upper conductive layers 21a1 that are included in the plurality of upper conductive layers (upper select gate lines) 21a and that are stacked successively. In the example shown in FIG. 2 to FIG. 5, the contact 51 is connected to two upper conductive layers 21a1 including the uppermost conductive layer 21. A common signal is applied from the contact 51 to two or more upper conductive layers 21a1.

The contact 51 is provided to extend over upper surfaces of the two or more upper conductive layers 21a1. In other words, the contact 51 is provided continuously to cross one or more rising portions 25 for the two or more upper conductive layers 21a1. In addition, the planar shape of the contact 51 is elliptical as viewed from the Z direction. More specifically, the planar shape of the contact 51 is an elliptical shape whose major axis (longitudinal axis) crosses the rising portions 25.

The contact 52 is connected to two or more upper conductive layers 21a2 that are included in the plurality of upper conductive layers (upper select gate lines) 21a, that are located on the lower layer side of the upper conductive layer 21a1, and that are stacked successively. In the example shown in FIG. 2 to FIG. 5, the contact 52 is connected to two upper conductive layers 21a2. A common signal is applied from the contact 52 to two or more upper conductive layers 21a2.

The contact 52 is provided to extend over upper surfaces of the two or more upper conductive layers 21a2. In other words, the contact 52 is provided continuously to cross one or more rising portions 25 for the two or more upper conductive layers 21a2. In addition, the planar shape of the contact 52 is elliptical as viewed from the Z direction. More specifically, the planar shape of the contact 52 is an elliptical shape whose major axis crosses the rising portion 25.

The contacts 53 are individually connected to the plurality of lower conductive layers (word lines) 21b. In other words, the contacts 53 are not commonly connected to extend over the plurality of conductive layers 21, unlike the contacts 51 and 52, but are connected independently to each of the lower conductive layers 21b.

In the example shown in FIG. 4, the planar shape of the contact 53 has a substantially circular shape as viewed from the Z direction. However, the planar shape of the contact 53 is not particularly limited, but may be, for example, an elliptical shape or the like.

The stacked body 20 is covered with an interlayer insulating layer 60 formed of silicon oxide or the like, and the contacts 51, 52, and 53 penetrate the interlayer insulating layer 60.

As described above, the contact 51 is continuously provided to extend over the upper surfaces of the two or more upper conductive layers 21a1, and the contact 52 is continuously provided to extend over the upper surfaces of two or more upper conductive layers 21a2. For this reason, the X-directional width of the upper surface of each of the two or more upper conductive layers 21a1 to which the contact 51 is connected and the X-directional width of the upper surface of each of the two or more upper conductive layers 21a2 to which the contact 52 is connected are shorter than the X-directional width of the upper surface of each of the lower conductive layers 21b to which the contacts 53 are connected.

In other words, a distance between adjacent rising portions 25 of the rising portions 25 for two or more upper conductive layers 21a1 is shorter than a distance between adjacent rising portions 25 of the rising portions 25 for the plurality of lower conductive layers 21b. Similarly, a distance between adjacent rising portions 25 of the rising portions 25 for two or more upper conductive layers 21a2 is shorter than a distance between adjacent rising portions 25 of the rising portions 25 for the plurality of lower conductive layers 21b.

As described above, in the embodiment, the contact 51 is continuously provided to extend over the upper surfaces of the two or more upper conductive layers 21a1, and the contact 52 is continuously provided to extend over the upper surfaces of the two or more upper conductive layers 21a2. In other words, the contact 51 is connected commonly to the two or more upper conductive layers 21a1, and the contact 52 is connected commonly to the two or more upper conductive layers 21a2. When the contacts are connected individually to each of the upper conductive layers 21a1 and each of the upper conductive layers 21a2, the X-directional width of the terrace portion 26 needs to be increased to secure a margin in the X direction for arranging the contacts. For this reason, the area of the region for connecting the contacts becomes larger.

In the embodiment, the contact 51 is continuously connected to the two or more upper conductive layers 21a1, and the contact 52 is continuously connected to the two or more upper conductive layers 21a2. For this reason, the X-directional width of the terrace portion 26 can be reduced, and the area of the region for connecting the contacts can be reduced. As a result, the chip area of the semiconductor memory device can be reduced.

Figure 8:
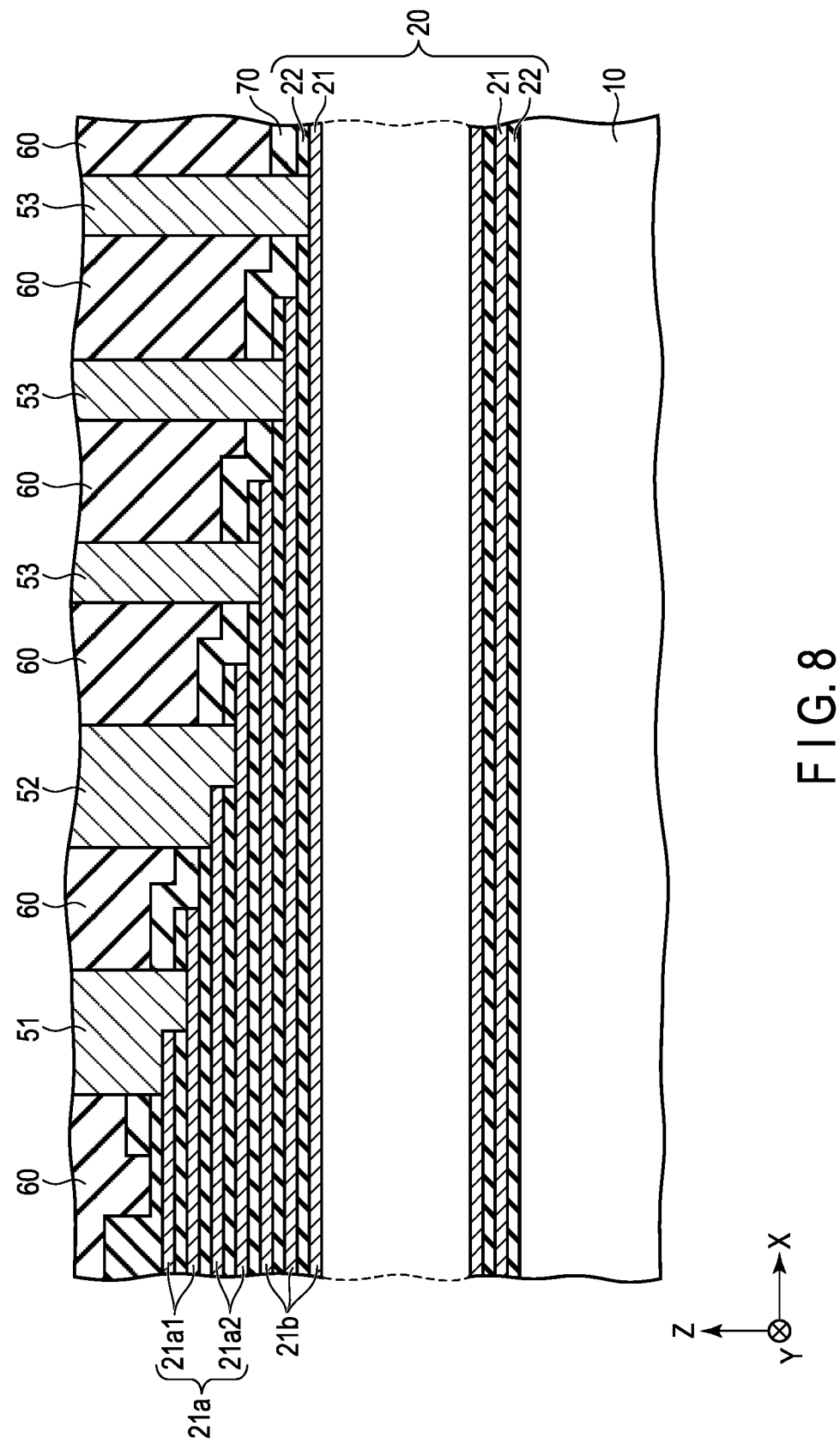
FIG. 8 is a cross-sectional view schematically showing a configuration of the stairs region, in a first modified example of the semiconductor memory device according to the embodiment.

FIG. 8 is a cross-sectional view schematically showing the configuration of the stairs region 200 according to a first modified example of the embodiment. The planar pattern view is the same as FIG. 4.

In this modified example, a stopper insulating layer 70 is provided on the stacked body 20, and the contacts 51, 52, and 53 penetrate the stopper insulating layer 70. The stopper insulating layer 70 functions as an etching stopper when forming contact holes for the contacts 51, 52, and 53.

The basic configuration of the modified example is the same as that of the above-described embodiment, and the same advantages as those of the above-described embodiment can also be obtained in the modified example.

Figure 9:
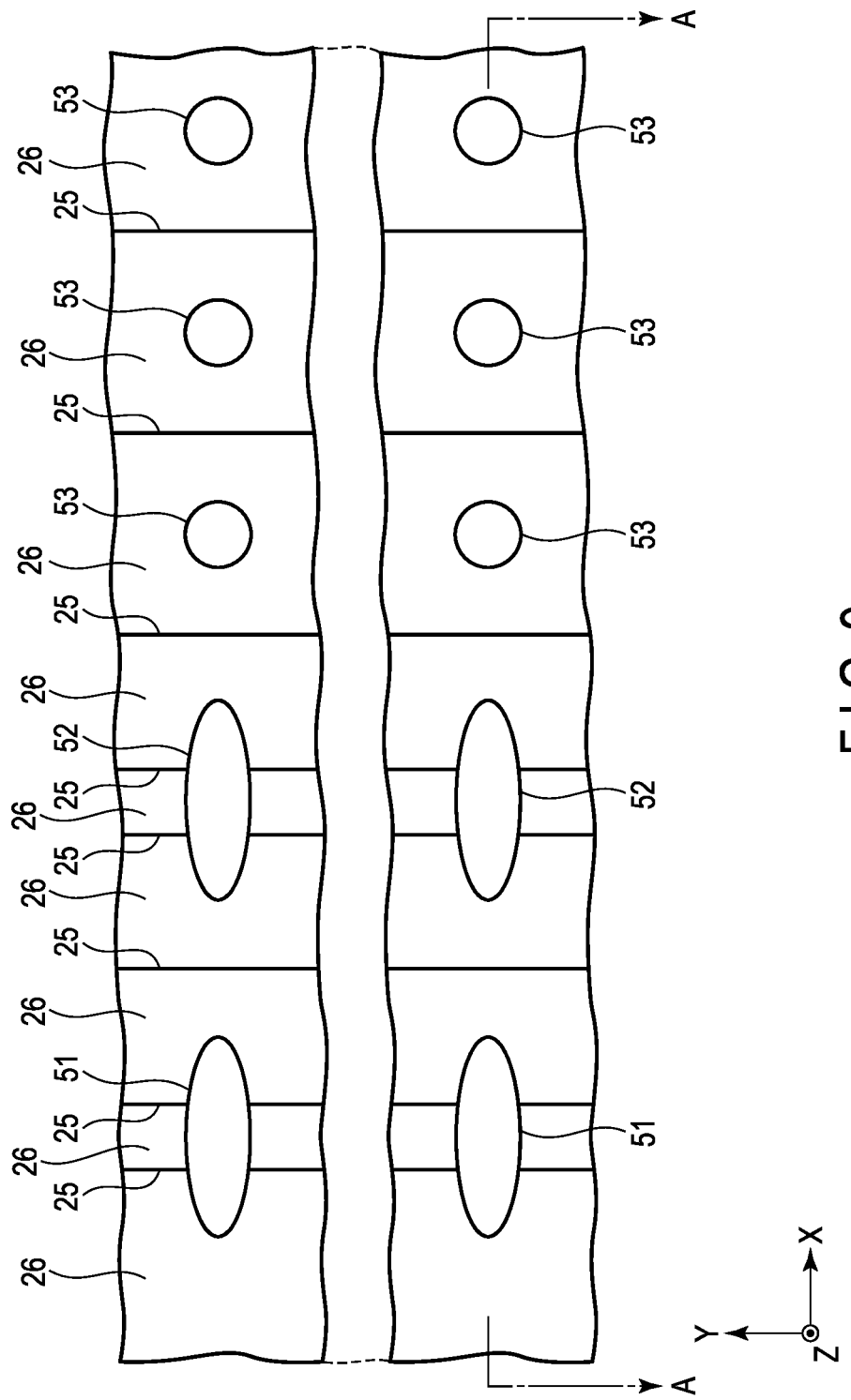
FIG. 9 is a planar pattern view schematically showing a configuration of the stairs region, in a second modified example of the semiconductor memory device according to the embodiment.
Figure 10:
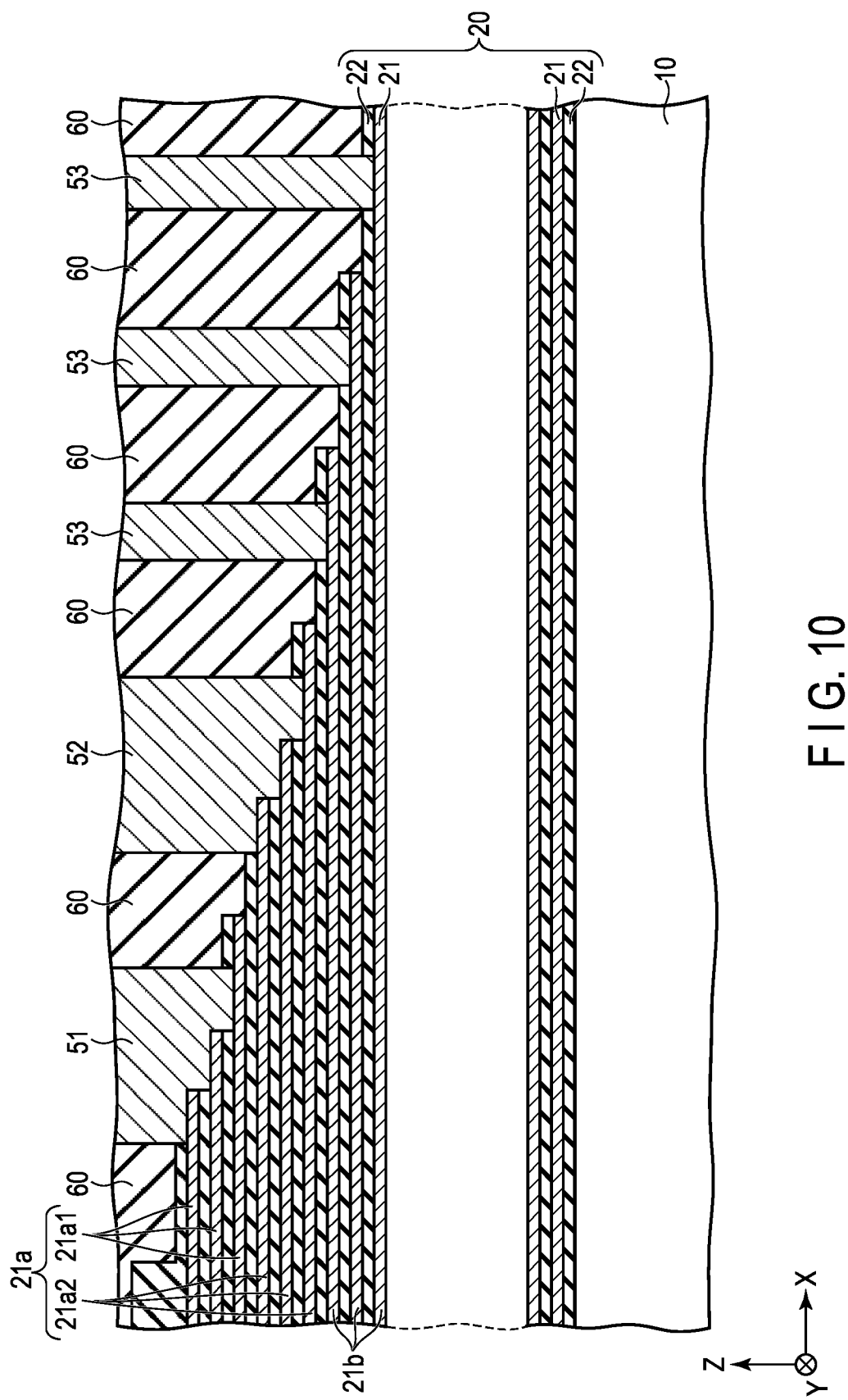
FIG. 10 is a cross-sectional view schematically showing a configuration of the stairs region, in the second modified example of the semiconductor memory device according to the embodiment.

FIG. 9 and FIG. 10 are a planar pattern view and a cross-sectional view schematically showing the configuration of the stairs region 200 according to a second modified example of the embodiment. The cross section taken along line A-A in FIG. 9 corresponds to FIG. 10.

In this modified example, the contact 51 is connected to three successively stacked upper conductive layers 21a1, and the contact 52 is connected to three successively stacked upper conductive layers 21a2.

The basic configuration of the modified example is the same as that of the above-described embodiment, and the same advantages as those of the above-described embodiment can also be obtained in the modified example.

In addition, when the contact 51 is connected to three or more successively stacked upper conductive layers 21a1 as in the case of the modified example, the X-directional width of the terrace portions 26 (i.e., the width in the direction of arrangement of the terrace portions 26) of the upper conductive layer 21a1 provided between the uppermost upper conductive layer 21a1 and the lowermost upper conductive layer 21a1, of the three or more upper conductive layers 21a1, can be made shorter than the X-directional width of the terrace portion 26 of the uppermost upper conductive layer 21a1, of the three or more upper conductive layers 21a1, and the X-directional width of the terrace portion 26 of the lowermost upper conductive layer 21a1, of the three or more upper conductive layers 21a1. The configuration is also applied to the three or more upper conductive layers 21a2.

Therefore, the area of the region for connecting contacts more efficiently can be reduced in the modified example.

Figure 11:
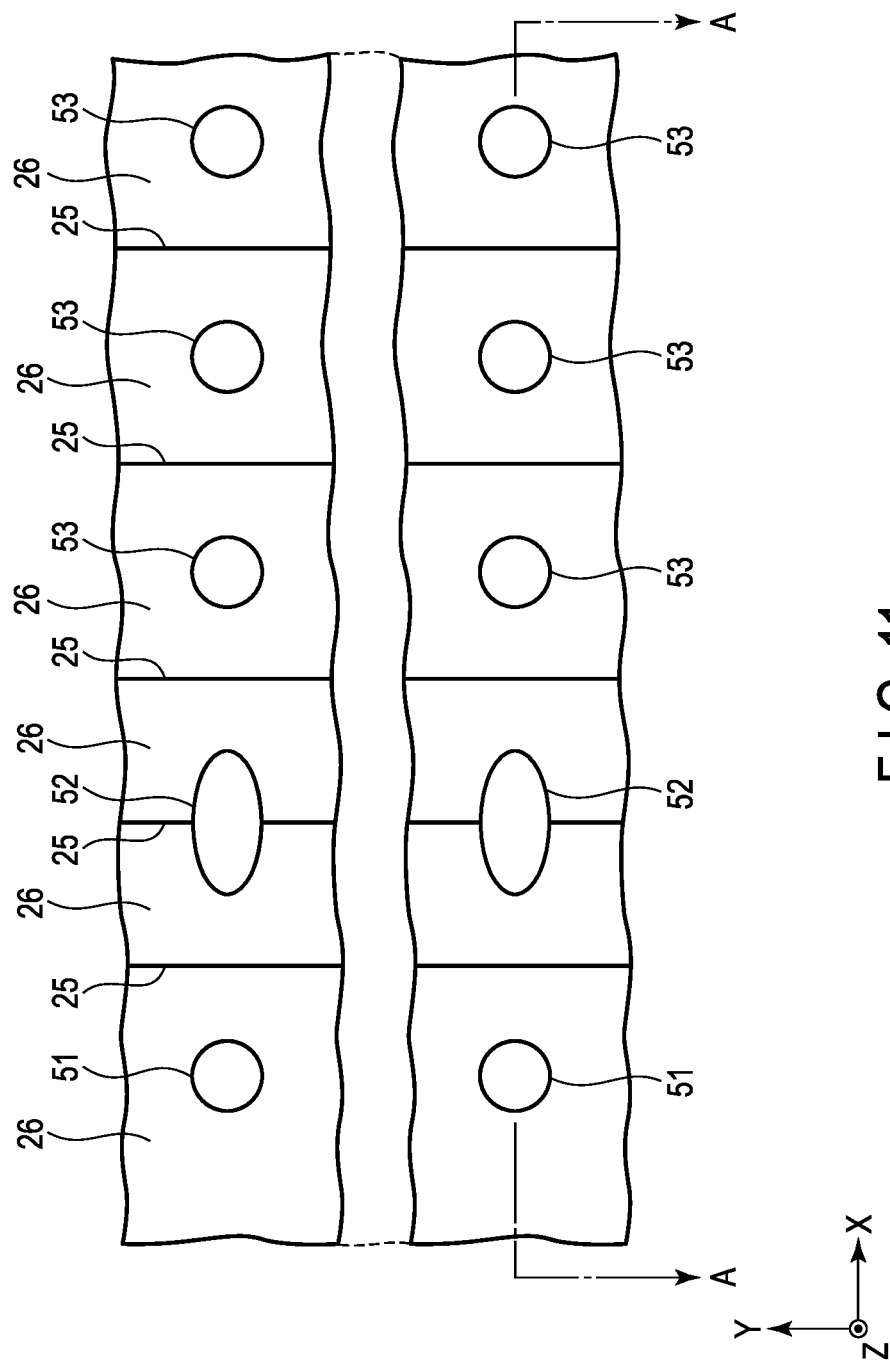
FIG. 11 is a planar pattern view schematically showing a configuration of the stairs region, in a third modified example of the semiconductor memory device according to the embodiment.
Figure 12:
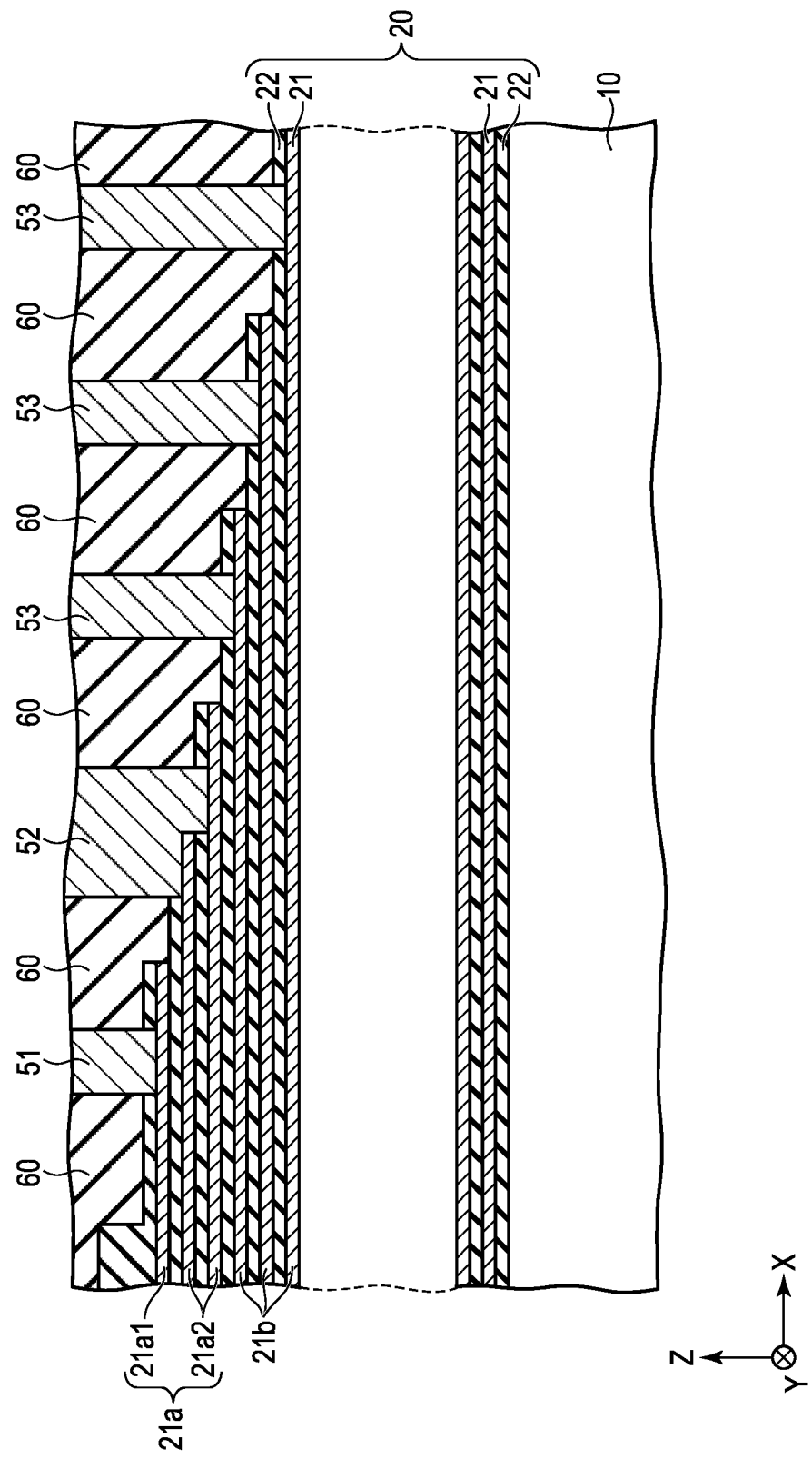
FIG. 12 is a cross-sectional view schematically showing a configuration of the stairs region, in the third modified example of the semiconductor memory device according to the embodiment.

FIG. 11 and FIG. 12 are a planar pattern view and a cross-sectional view schematically showing the configuration of the stairs region 200 according to a third modified example of the embodiment. The cross section taken along line A-A in FIG. 11 corresponds to FIG. 12.

In this modified example, the contact 51 is connected to one upper conductive layer 21a1, and the contact 52 is connected to two or more successively stacked upper conductive layers 21a2 (i.e., the two upper conductive layers 21a2 in the example shown in FIG. 11 and FIG. 12). Thus, the number of upper conductive layers 21a1 may be one. In the example, the planar shape of the contact 51 is a substantially circular shape as viewed from the Z direction. However, the planar shape of the contact 51 is not particularly limited, but may be, for example, an elliptical shape or the like.

In the modified example, too, the form of connection of the contact 52 for the two or more upper conductive layers 21a2 is the same as that in the above-described embodiment and the second modified example, and the same advantages as those of the above-described embodiment and the second modified example can also be obtained in the modified example.

Figure 13:
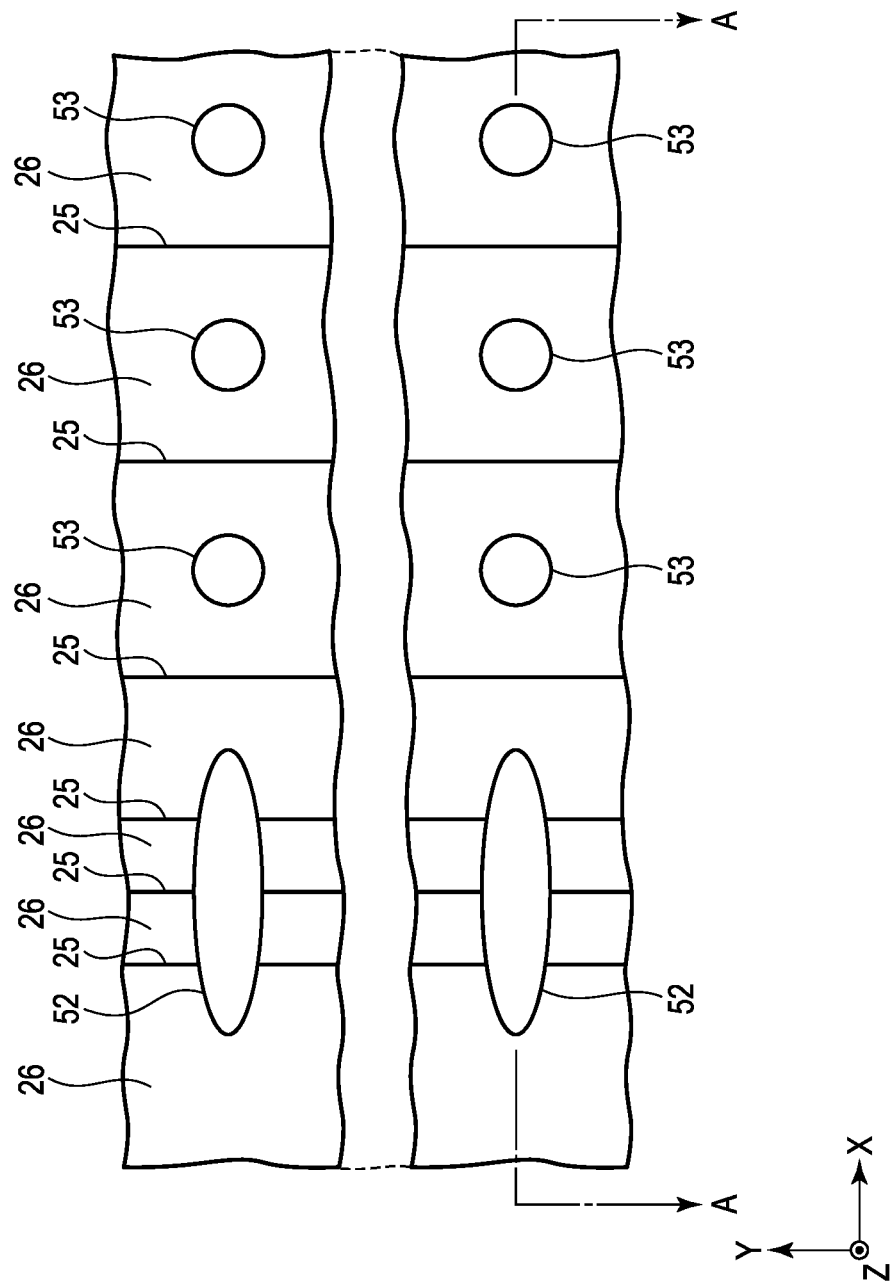
FIG. 13 is a planar pattern view schematically showing a configuration of the stairs region, in a fourth modified example of the semiconductor memory device according to the embodiment.
Figure 14:
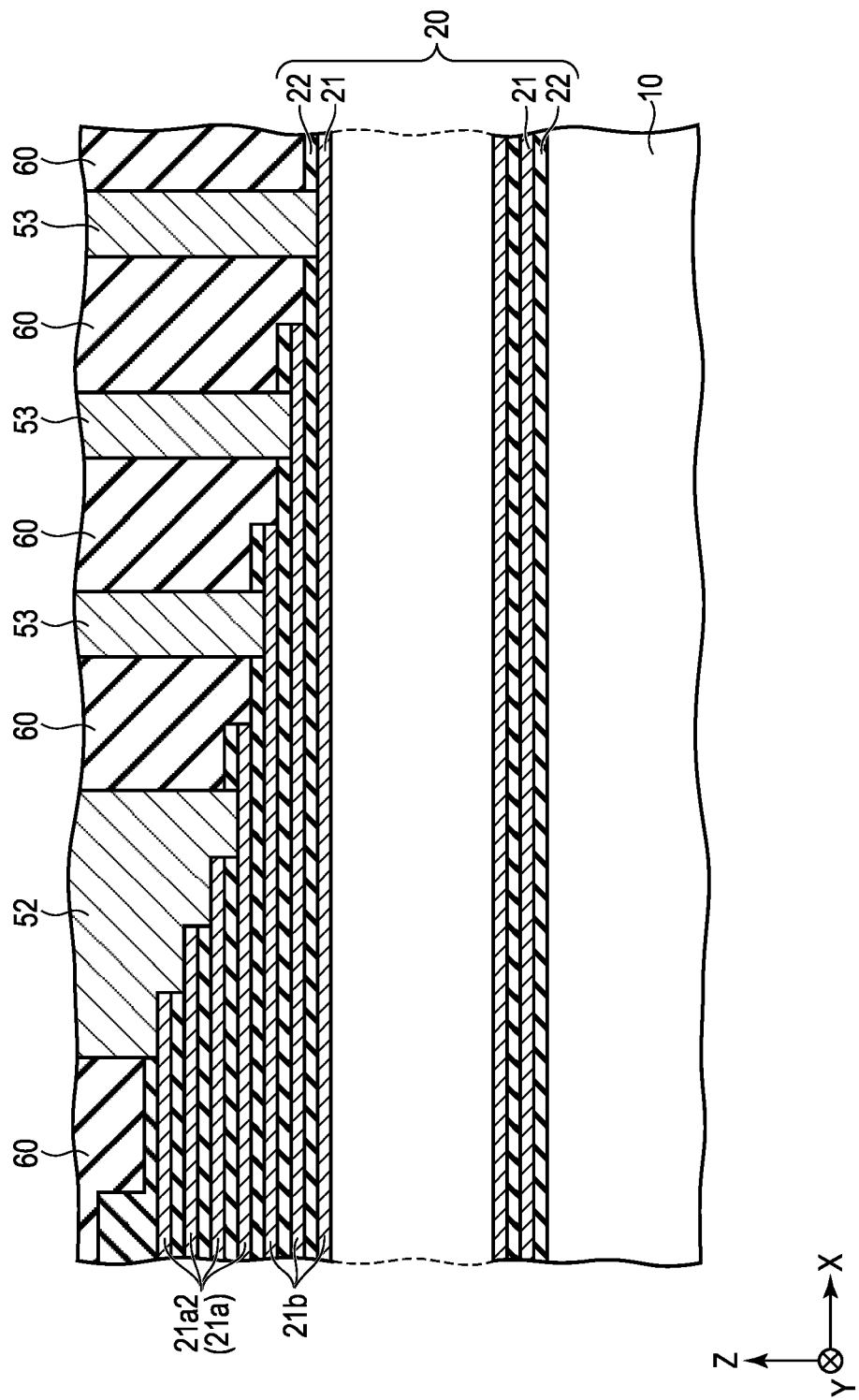
FIG. 14 is a cross-sectional view schematically showing a configuration of the stairs region, in the fourth modified example of the semiconductor memory device according to the embodiment.

FIG. 13 and FIG. 14 are a planar pattern view and a cross-sectional view schematically showing the configuration of the stairs region 200 according to a fourth modified example of the embodiment. The cross section taken along line A-A in FIG. 13 corresponds to FIG. 14.

In this modified example, the upper conductive layers 21a1 are not provided, and the contact 52 is connected to two or more successively stacked upper conductive layers 21a2 (i.e., four upper conductive layers 21a2 in the example shown in FIG. 13 and FIG. 14). Thus, the upper conductive layers 21a1 may not be provided.

In the modified example, too, the form of connection of the contact 52 for the two or more upper conductive layers 21a2 is the same as that in the above-described embodiment and the second modified example, and the same advantages as those of the above-described embodiment and the second modified example can also be obtained in the modified example.

As can be understood from the above-described embodiment and the first to fourth modified examples, the number of upper conductive layers 21a1 on the upper layer side (i.e., the upper conductive layers to which a voltage higher than that at the normal selection except for the time of erasing data is applied at the time of erasing data) and the number of upper conductive layers 21a2 on the lower layer side (i.e., the upper conductive layers to which the same voltage is applied at the time of erasing data and at the normal selection) are not particularly limited. When the number of either of the upper conductive layers 21a1 and the upper conductive layers 21a2 is two or more, the connection form of contacts 51 and 52 as described in the above embodiment and the first to fourth modified examples can be applied.

In addition, in the above-described embodiment and the first to fourth modified examples, the planar shape of the contacts 51 and 52 as viewed from the Z direction is an elliptical shape, but the planar shape of the contacts 51 and 52 is not limited to an elliptical shape.

FIG. 15 is a planar pattern view schematically showing a first modified example of the planar shape of the contacts 51 and 52. In this modified example, the planar shape of the contacts 51 and 52 as viewed from the Z direction is an oval shape.

FIG. 16 is a planar pattern view schematically showing a second modified example of the planar shape of the contacts 51 and 52. In this modified example, the planar shape of the contacts 51 and 52 as viewed from the Z direction is a rectangular shape.

As described above, the planar shape of the contacts 51 and 52 may be an oval shape or a rectangular shape as well as an elliptical shape. If the planar shape of the contacts 51 and 52 as viewed from the Z direction is a planar shape in which the major axis (longitudinal axis) crosses the rising portion 25, the same advantages as those of the above-described embodiment can be obtained.

In addition, in the above-described embodiment and the first to fourth modified examples, the number of a row of the contacts 53 in one block is one, for the plurality of contacts 53 provided with respect to the plurality of lower conductive layers (word lines) 21b, respectively, but the plurality of contacts 53 may be provided in an arrangement in which a plurality of contact rows are arranged in the Y direction in one block.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
    a stacked body in which a plurality of conductive layers including a plurality of upper conductive layers and a plurality of lower conductive layers provided on a lower layer side of the plurality of upper conductive layers are stacked to be apart from each other in a first direction, and which includes a stairs-shaped end portion, the plurality of upper conductive layers functioning as select gate lines for a NAND string, and the plurality of lower conductive layers functioning as word lines for the NAND string;
    a plurality of pillar structures each including a semiconductor layer extending in the first direction through the stacked body; and
    a first contact connected to two or more first upper conductive layers that are included in the plurality of upper conductive layers and that are stacked successively, and provided to extend over upper surfaces of the two or more first upper conductive layers, wherein
    the stairs-shaped end portion of the stacked body is defined by a plurality of rising portions and a plurality of terrace portions extending substantially parallel to a plane perpendicular to the first direction from upper ends of the plurality of rising portions, and
    the first contact has a planar shape whose major axis crosses one or more of the rising portions as viewed from the first direction.

2. The device of claim 1, wherein
    a distance between adjacent rising portions of two or more of the rising portions for the two or more first upper conductive layers is shorter than a distance between adjacent rising portions of a plurality of the rising portions for the plurality of lower conductive layers.

3. The device of claim 1, wherein
    the plurality of terrace portions are arranged in a second direction, the first contact is provided to extend over upper surfaces of three or more of the first upper conductive layers, and a width in the second direction of the terrace portion of an intermediate first upper conductive layer provided between an uppermost first upper conductive layer of the three or more first upper conductive layers and a lowermost first upper conductive layer of the three or more first upper conductive layers, is shorter than a width in the second direction of the terrace portion of the uppermost first upper conductive layer, and is shorter than a width in the second direction of the terrace portion of the lowermost first upper conductive layer.

4. The device of claim 1, wherein
a shape of the first contact is an elliptical shape, an oval shape, or a rectangular shape as viewed from the first direction.

5. The device of claim 1, further comprising:
a second contact connected to two or more second upper conductive layers that are included in the plurality of upper conductive layers, that are located on an upper layer side of the two or more first upper conductive layers, and that are stacked successively, and provided to extend over upper surfaces of the two or more second upper conductive layers.

6. The device of claim 5, wherein
the second contact has a planar shape whose major axis crosses one or more of the rising portions as viewed from the first direction.

7. The device of claim 5, wherein
a distance between adjacent rising portions of two or more of the rising portions for the two or more second upper conductive layers is shorter than a distance between adjacent rising portions of a plurality of the rising portions for the plurality of lower conductive layers.

8. The device of claim 5, wherein
a shape of the second contact is an elliptical shape, an oval shape, or a rectangular shape as viewed from the first direction.

9. The device of claim 5, wherein
a voltage higher than a voltage applied to the two or more first upper conductive layers is applied to the two or more second upper conductive layers at a time of erasing data.

10. The device of claim 1, further comprising:
a second contact connected to one second upper conductive layer that is included in the plurality of upper conductive layers and that is located on an upper layer side of the two or more first upper conductive layers.

11. The device of claim 10, wherein
a shape of the second contact is a substantially circular shape as viewed from the first direction.

12. The device of claim 1, further comprising:
a plurality of third contacts individually connected to the plurality of lower conductive layers, respectively.

13. The device of claim 12, wherein
a shape of one of the third contacts is a substantially circular shape as viewed from the first direction.

14. The device of claim 1, wherein
the major axis of the first contact crosses the one or more of the rising portions to overlap one or more surfaces of one or more of the terrace portions corresponding to the one or more of the rising portions, the one or more surfaces extending substantially parallel to the plane perpendicular to the first direction.

15. The device of claim 1, wherein
the first contact has a bottom surface with two planar portions in contact with respective ones of the first upper conductive layers, and
the two planar portion are at different levels in the first direction.

* * * * *